(12) United States Patent
Yoon et al.

(10) Patent No.: US 7,787,276 B2
(45) Date of Patent: Aug. 31, 2010

(54) MEMORY ARRAY USING MECHANICAL SWITCH AND METHOD FOR OPERATING THEREOF

(75) Inventors: Jun-Bo Yoon, Daejeon (KR); Weon-Wi Jang, Daejeon (KR); Jeong-Oen Lee, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 155 days.

(21) Appl. No.: 12/122,318

(22) Filed: May 16, 2008

(65) Prior Publication Data

US 2009/0021972 A1    Jan. 22, 2009

(30) Foreign Application Priority Data

May 18, 2007    (KR) ...................... 10-2007-0048464

(51) Int. Cl.
*G11C 5/00*    (2006.01)
(52) U.S. Cl. .......................................... 365/52; 365/149
(58) Field of Classification Search .................. 365/150
See application file for complete search history.

(56) References Cited

U.S. PATENT DOCUMENTS

| | | | |
|---|---|---|---|
| 6,509,605 B1 | 1/2003 | Smith | |
| 6,534,839 B1 | 3/2003 | Frazier et al. | |
| 6,982,903 B2 * | 1/2006 | Bertin et al. | ................ 365/163 |
| 7,495,952 B2 * | 2/2009 | Lal et al. | ..................... 365/164 |
| 2005/0063244 A1 * | 3/2005 | Bertin et al. | ................ 365/232 |

FOREIGN PATENT DOCUMENTS

KR    100651825    11/2006

OTHER PUBLICATIONS

"Switching Characteristics of Electrostatically Actuated Miniaturized Micromechanical Metallic Cantilevers," Teh, W.H., et al., J. Vac. Sci. Technol. B 21 (6) Nov./Dec. 2003, pp. 2360-2367.
"The Resonant Gate Transister," Nathanson, Harvey C. et al., IEEE Transactions on Electron Devices, vol. Ed-14, No. 3, Mar. 1967, pp. 117-133.

* cited by examiner

*Primary Examiner*—Tan T. Nguyen
(74) *Attorney, Agent, or Firm*—The Belles Group, PC

(57) ABSTRACT

A method for controlling a memory array using a mechanical switch according to the present invention, in which the memory array comprises; a plurality of word lines; a plurality of bit lines intersecting each other with the plurality of word lines; a gate electrode connected to each of the word lines; a drain electrode spaced apart from the gate electrode and connected to a capacitor; and a source electrode comprises: an anchor part spaced apart from the gate electrode and connected to each of the bit lines; a mobile part where a dimple is formed, comprises the steps of: applying a first voltage $V_1$ to the bit line selected from the plurality of bit lines; applying a second voltage $V_2$ greater than a sum of the first voltage V1 and a pull-in voltage $V_{pi}$ to the word lines selected from the plurality of word lines; and applying a voltage smaller than a sum of a erase voltage $V_{erase}$ and the pull-in voltage $V_{pi}$ and a voltage greater than a difference between a write voltage $V_{write}$ and the pull-in voltage $V_{pi}$ to the word lines unselected from the plurality of word lines.

8 Claims, 8 Drawing Sheets

MEMORY ARRAY USING MECHANICAL SWITCH AND METHOD FOR OPERATING THEREOF

This Nonprovisional application claims priority under 35 USC. §119(a) on Patent Application No. 10-2007-0048464 filed in Korea on May 18, 2007, the entire contents of which are hereby incorporated by reference.

BACKGROUND

1. Field

The present invention relates to a memory array using a mechanical switch and a method for operating thereof, and more particularly, to a method for performing a reading, a writing, an erasing operation of the memory array, and a selecting operation of a multi-bit and a single memory cell.

2. Description of the Background Art

Until now, a degree of integration of a semiconductor transistor greatly increases according to Moore's law, thereby much contributing to the development of a semiconductor industry. In general, the semiconductor transistor has been used as a switching device using an on or off characteristic and an amplifying device using a current and voltage amplification characteristic. In a digital integration circuit particularly, the semiconductor transistor has been mainly used as the switching device. However, the semiconductor transistor has a drawback that it should be necessarily formed on a semiconductor substrate and thus, should consider a body effect of the semiconductor substrate. Particularly, the semiconductor transistor has a drawback of a leakage of electrical charges inevitably caused by its internal leakage source. In addition, the semiconductor transistor has a drawback that its sensitivity to an external harmful environment such as radiation causes a soft error rate (SER). The semiconductor transistor has a drawback that a degradation of its gate oxide film causes a reduction of an electrical reliability, and an increase of the degree of integration causes a short channel effect such as a reduction of a sub-threshold swing and hot election injection.

In order to overcome conventional several drawbacks of the semiconductor transistor serving as the switching device, a mechanical switch using a recent Micro-Electro-Mechanical System (MEMS) or Nano-Electro-Mechanical System (NEMS) is being researched and developed.

FIG. 1 is a conceptual diagram illustrating a conventional mechanical switch Referring to FIG. 1, the conventional mechanical switch, which is disclosed in U.S. Pat. No. 6,534,839 and W. H. Teh, et. al., "Switching characteristics of electrostatically actuated miniaturized micromechanical metallic catilevers", J. Vac. Sci. Technol., B. 21, pp. 2360-2367, 2003, is of a structure comprising a gate electrode 10, a drain electrode 30, and a source electrode 20 comprised of an anchor part 21 and a mobile part 22. An operation of the mechanical switch is characterized in that the mobile part 22 of the source electrode 20 electrically contacts with the drain electrode 30, thereby electrically conducting the source electrode 20 and the drain electrode 30 in generation of an electrostatic force based on a pull-in voltage $V_{pi}$ difference between the gate electrode 10 and the source electrode 20, and the source electrode 20 and the drain electrode 30 are electrically disconnected in the absence of the generation of the electrostatic force. Herein, the pull-in voltage can be defined as the voltage difference between the source electrode 20 and the gate electrode 10, required for electrically conducting the source electrode 20 and the drain electrode 30 of the mechanical switch.

The pull-in state occurs when the mobile part 22 of the source electrode 20 shifts by one third of a distance between the mobile part 22 of the source electrode 20 and the gate electrode 10. The pull-in voltage is similar in function with a threshold voltage of a metal oxide semiconductor (MOS) transistor (H. C. Nathanson, et al, "The resonant gate transistor", IEEE Transactions on Electron Devices, Vol. ED-104, No. 3, pp. 117-133, 1967).

Recently, U.S. Pat. No. 6,509,605 discloses a memory array constructed using a mechanical switch, in which an operation voltage is low and an operation speed is fast and thus, a power consumption is low and writing and reading time are short as well as an electrical reliability is not deteriorated because of mechanical actuation, and a sensitivity to radiation is poor. The memory array is being researched and developed as a next generation memory array to replace a conventional memory array.

However, the memory array of U.S. Pat. No. 6,509,605 cannot be controlled because of its construction using only the mechanical switch and thus, has a drawback in that it should be constructed in combination with a complementary metal oxide semiconductor (CMOS) transistor. Accordingly, the memory array of U.S. Pat. No. 6,509,605 gets so complex in construction and process and causes a scaling limit, thereby reducing a degree of integration.

In order to overcome the drawback, Korea Patent No. 10-0651825 (i.e., memory array using a mechanical switch and method for controlling thereof, display device using a mechanical switch and method for controlling thereof) as described in FIG. 3 is proposed.

FIG. 2 is a circuit diagram illustrating a conventional memory array using a MOS transistor. Referring to FIG. 2, an input voltage of a source voltage or a ground voltage is applied to a bit line B/L0 connected to a selected MOS transistor of a memory cell 90, and a threshold voltage or more of the MOS transistor is applied to a word line W/L0 connected to the selected MOS transistor. Thus, the applied voltage of the bit line B/L0 is transferred to a storage unit 80 through electrically conducted source electrode 60 and drain electrode 70, and the applied voltage of the bit line B/L0 is stored in the storage unit 80. Less than the threshold voltage is applied to word lines (W/L1 and W/L2) not connected to the selected MOS transistor. Thus, the source electrode 60 and the drain electrode 70 electrically disconnect with each other, and the applied voltage of the bit line is not transferred to the storage unit 80.

The configuration of the memory array using a mechanical switch described in FIG. 3 is different from that of the memory array using a MOS transistor described in FIG. 2 and thus, a control method using a mechanical switch described in FIG. 3 is different from that of the memory array using a MOS transistor described in FIG. 2. Therefore, a method for effectively controlling the memory array using the mechanical switch described in FIG. 3 is being required.

SUMMARY

Accordingly, the present invention is to provide a method for operating (i.e., reading, writing, erasing) a memory array constructed using a mechanical switch.

Also, the present invention is to provide a method for performing a multi-bit operation of a memory array constructed using a mechanical switch.

Also, the present invention is to provide a method for performing a selecting operation of a single memory cell of a memory array constructed using a mechanical switch.

In one aspect, there is provided a method for operating a memory array using a mechanical switch, in which the memory array comprises a plurality of word lines, and a plurality of bit lines intersecting each other with the plurality of word lines, and a gate electrode connected to each of the word lines, and a drain electrode spaced apart from the gate electrode and connected to a capacitor, and a source electrode. The source electrode comprises an anchor part spaced apart from the gate electrode and connected to each of the bit lines, and a mobile part where a dimple is formed. The method comprises steps of: applying a first voltage $V_1$ to the bit line selected from the plurality of bit lines; and applying a second voltage $V_2$ greater than a sum of the first voltage V1 and a pull-in voltage $V_{pi}$ to the word lines selected from the plurality of word lines; and applying a voltage smaller than a sum of a erase voltage $V_{erase}$ and the pull-in voltage $V_{pi}$ and a voltage greater than a difference between a write voltage $V_{write}$ and the pull-in voltage $V_{pi}$ to the word lines unselected from the plurality of word lines.

The first voltage $V_1$ may be a read voltage $V_{read}$, and the read voltage $V_{read}$ may be a middle value of a sum of the write voltage $V_{write}$ and the erase voltage $V_{erase}$.

The first voltage $V_1$ may be the write voltage $V_{write}$.

The method further comprises the step of applying a pre-write voltage $V_{pre-write}$ to the bit line unselected from the plurality of bit lines.

The first voltage $V_1$ may be the erase voltage $V_{erase}$.

The method further comprises the step of applying a pre-erase voltage $V_{pre-erase}$ to the bit line unselected from the plurality of bit lines.

In another aspect, there is provided a method for operating a memory array using a mechanical switch, in which the memory array comprises a plurality of word lines, and a plurality of bit lines intersecting each other with the plurality of word lines, and a gate electrode connected to each of the word lines, and a drain electrode spaced apart from the gate electrode and connected to a capacitor, and a source electrode. The source electrode comprises an anchor part spaced apart from the gate electrode and connected to each of the bit lines, and a mobile part where a dimple is formed. The method comprising steps of: applying respectively write voltages $V_{write}$ or erase voltages $V_{erase}$ having a different voltage magnitude to the bit lines more than two selected from the plurality of bit lines; and applying a voltage greater than a sum of a maximal write voltage $V_{write-max}$ and a pull-in voltage $V_{pi}$ of the write voltages $V_{write}$ or the erase voltages $V_{erase}$ to the word lines selected from the plurality of word lines; and applying a voltage smaller than a sum of the erase voltage $V_{erase}$ and the pull-in voltage $V_{pi}$ and a voltage smaller than a difference between the maximal write voltage $V_{write-max}$ and the pull-in voltage $V_{pi}$ to the bit lines unselected from the plurality of bit lines.

In a further another aspect, there is provided a method for operating a memory array using a mechanical switch, in which the memory array comprises a plurality of word lines, and a plurality of bit lines intersecting each other with the plurality of word lines, and a gate electrode connected to each of the word lines, and a drain electrode spaced apart from the gate electrode and connected to a capacitor; and a source electrode. The source electrode comprises an anchor part spaced apart from the gate electrode and connected to each of the bit lines, and a mobile part where a dimple is formed. The method comprises steps of: applying a write voltages $V_{write}$ and an erase voltages $V_{erase}$ to the bit line selected from the plurality of bit lines; and applying a voltage greater than a sum of the write voltage $V_{write}$ and a pull-in voltage $V_{pi}$ to the word lines selected from the plurality of word lines; and applying a voltage smaller than a sum of the erase voltage $V_{erase}$ and the pull-in voltage $V_{pi}$ and a voltage greater than the write voltage $V_{write}$, or a voltage smaller than a difference between a voltage greater than the write voltage $V_{write}$ and the pull-in voltage $V_{pi}$ and a voltage greater than the erase voltage $V_{erase}$ to the word lines unselected from the plurality of word lines.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

Figure 1:
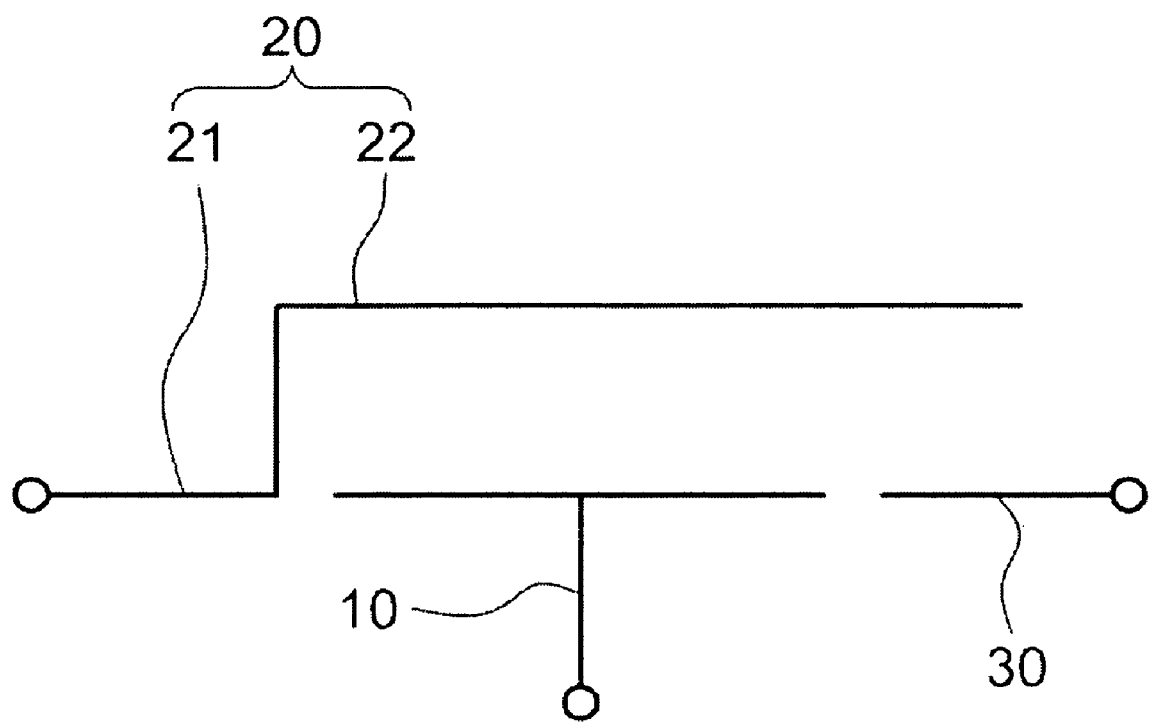
FIG. 1 is a conceptual diagram illustrating a conventional mechanical switch.
Figure 2:
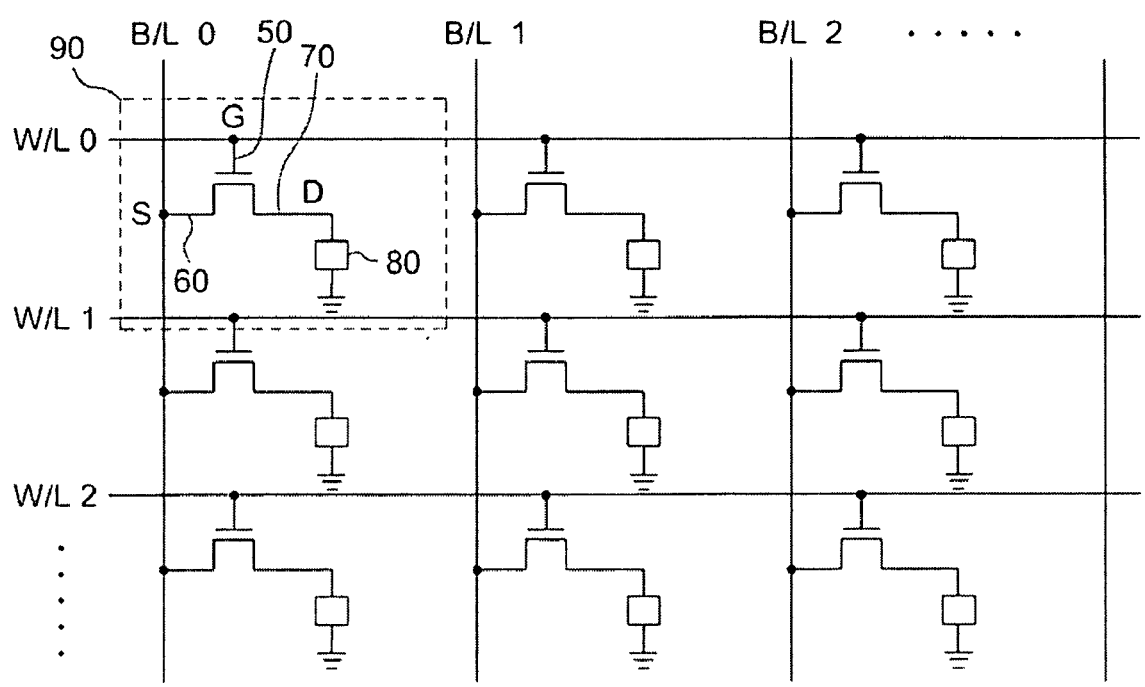
FIG. 2 is a circuit diagram illustrating a conventional memory array using a MOS switch.
Figure 3:
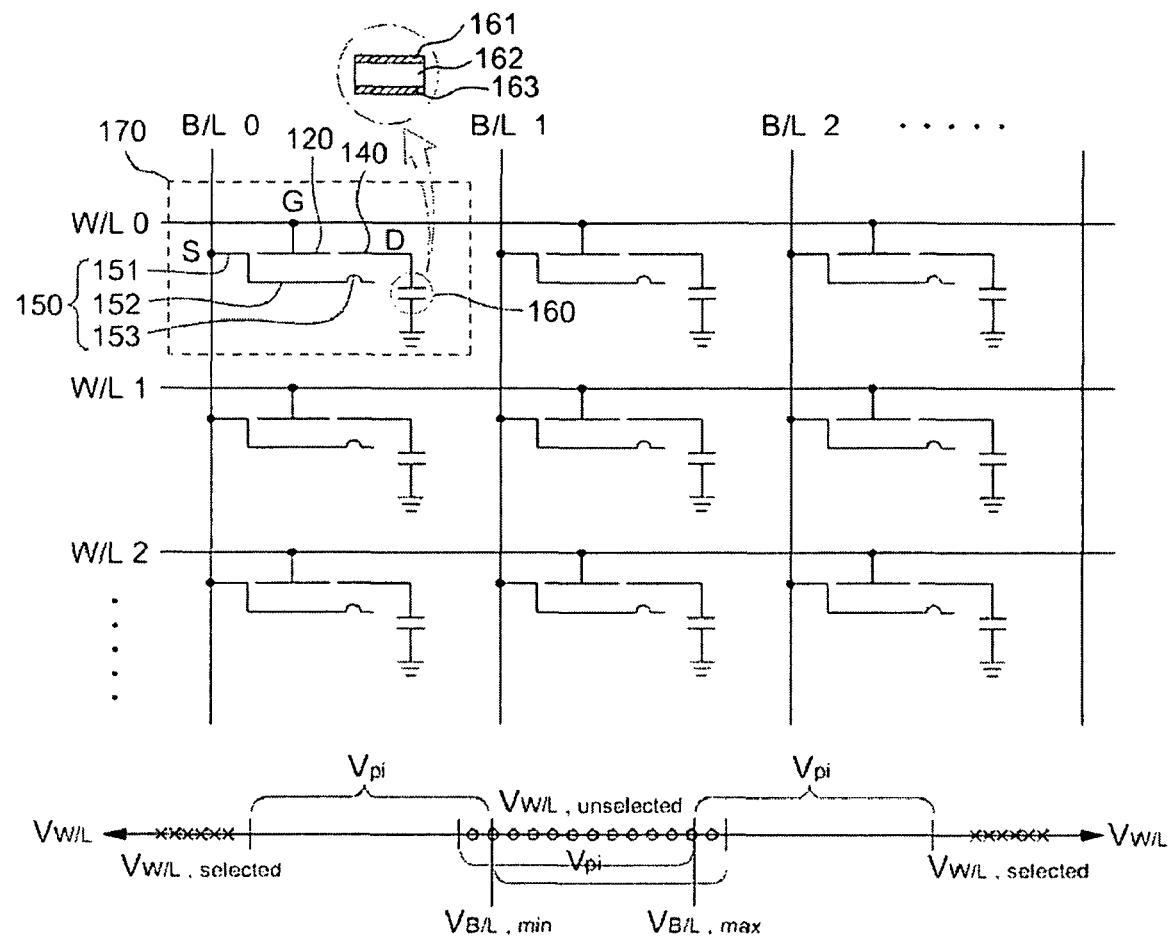
FIG. 3 is a circuit diagram illustrating a memory array using a mechanical switch applying a method for operating a memory array using a mechanical switch according to the present invention.

FIG. 3 is a circuit diagram illustrating a memory array using a mechanical switch applying a method for operating a memory array using a mechanical switch according to the present invention.

As shown in FIG. 3, the memory array using the mechanical switch according to the present invention comprises a plurality of word lines (W/L0, W/L1, and W/L2), a plurality of bit lines (B/L0, B/L1, and B/L2), and a plurality of mechanical switches.

The plurality of bit lines (B/L0, B/L1, and B/L2) intersects each other with the plurality of word lines (W/L0, W/L1, and W/L2). The plurality of mechanical switches is disposed at an intersection of the plurality of word lines (W/L0, W/L1, and W/L2) and the plurality of bit lines (B/L0, B/L1, and B/L2). Each of the mechanical switches comprises a gate electrode 120 connected with each of the word lines (W/L0, W/L1, and W/L2); a drain electrode 140 spaced apart from the gate electrode 120 and connected to a capacitor 160; and a source electrode 150. The source electrode 150 comprises an anchor part 151 spaced apart from the gate electrode 120 and connected to each of the bit lines (B/L0, B/L1, and B/L2); a mobile part 152 extended from the anchor part 151 and spaced apart from the gate electrode 120; and a dimple 153 extended from the mobile part 152 and formed in a protrusion shape.

In each of the plurality of mechanical switches, the dimple 153 of the source electrode 150 contacts with the drain electrode 140 by a difference between a voltage applied to the gate electrode 120 and a voltage applied to the source electrode 150, and the voltage applied to the source electrode 150 is transferred to the drain electrode 140. In other words, when the difference between the voltage applied to the gate electrode 120 and the voltage applied to the source electrode 150 is more than a pull-in voltage $V_{pi}$, an electrostatic force is generated, thereby making the dimple 153 of the source electrode 150 electrically contact with the drain electrode 140, and transferring the voltage applied to the source electrode 150 to the drain electrode 140.

In order to effectively control the memory array using the mechanical switch described in FIG. 3, voltages are applied to the plurality of word lines (W/L0, W/L1, and W/L2) under the conditions of ① and ③.

① Condition of Applying Voltage to Selected Word Line:

$|V_{W/L, selected} - V_{B/L}| > V_{pi}$ $(V_{W/L, selected} > V_{B/L, max} + V_{pi}$ or $V_{W/L, selected} < V_{B/L, min} - V_{pi})$ ② Condition of Applying Voltage to Unselected Word Line:

$|V_{W/L, unselected} - V_{B/L}| < V_{pi}$ $(V_{B/L, max} - V_{pi} < V_{W/L, unselected} < V_{B/L, min} + V_{pi})$ ③ Pull-in Voltage:

$V_{pi} > |V_{B/L, max} - V_{B/L, min}|$

A voltage ($V_{W/L, selected} > V_{B/L, max} + V_{pi}$) greater than a sum of a maximal voltage $V_{B/L, max}$ of the bit line and the pull-in voltage $V_{pi}$ or a voltage ($V_{W/L, selected} < V_{B/L, min} - V_{pi}$) smaller than a difference between a minimal voltage $V_{B/L, min}$ of the bit line and the pull-in voltage $V_{pi}$ is applied to the word line W/L0 selected from the plurality of word lines (W/L0, W/L1, and W/L2). A voltage ($V_{B/L, max} - V_{pi} < V_{W/L, unselected} < V_{B/L, min} + V_{pi}$) smaller than a slim of the minimal voltage $V_{B/L, min}$ of the bit line and the pull-in voltage $V_{pi}$ and a voltage greater than a difference between the maximal voltage $V_{B/L, max}$ of the bit line and the pull-in voltage $V_{pi}$ is applied to the word lines (W/L1 and W/L2) unselected from the plurality of word lines (W/L0, W/L1, and W/L2). The pull-in voltage ($V_{pi} > |V_{B/L, max} - V_{B/L, min}|$) is greater than a difference between the maximal voltage $V_{B/L, max}$ of the bit line and the minimal voltage $V_{B/L, min}$ of the bit line. The maximal voltage $V_{B/L, max}$ of the bit line refers to a voltage for indicating a high state of data stored in the capacitor 160. The minimal voltage $V_{B/L, min}$ of the bit line refers to a voltage for indicating a low state of the data stored in the capacitor 160.

For example, in case where the memory cell 170 is selected, the voltage ($V_{W/L, selected} > V_{B/L, max} + V_{pi}$) greater than the sum of the maximal voltage $V_{B/L, max}$ of the bit line and the pull-in voltage $V_{pi}$ or the voltage ($V_{W/L, selected} < V_{B/L, min} - V_{pi}$) smaller than the difference between the minimal voltage $V_{B/L, min}$ of the bit line and the pull-in voltage $V_{pi}$ is applied to the word line W/L0. The voltage ($V_{B/L, max} - V_{pi} < V_{W/L, unselected} < V_{B/L, min} + V_{pi}$) smaller than the sum of the minimal voltage $V_{B/L, min}$ of the bit line and the pull-in voltage $V_{pi}$ and the voltage greater than the difference between the maximal voltage $V_{B/L, max}$ of the bit line and the pull-in voltage $V_{pi}$ is applied to the word lines (W/L1 and W/L2). The maximal voltage $V_{B/L, max}$ of the bit line or the minimal voltage $V_{B/L, min}$ of the bit line is applied to the bit line.

Under the conditions, a difference between the application voltage of the gate electrode 120 connected to the word line W/L0 and the application voltage of the source electrode 150 connected to the bit line B/L0 becomes more than the pull-in voltage. Therefore, the electrostatic force is generated and the dimple 153 of the source electrode 150 contacts with the drain electrode 140. By doing so, the maximal voltage $V_{B/L, max}$ of the bit line applied to the bit line B/L0 or the minimal voltage $V_{B/L, min}$ of the bit line can be transferred to the capacitor 160 through the drain electrode 140, and can be stored in the capacitor 160.

A method for performing a reading, a wilting, an erasing operating of the memory array using a mechanical switch being described above, and a selecting a multi-bit and a single memory cell will be explained in the detailed manner with reference to FIG. 4 to FIG. 8. For reference, it is supposed that all of voltages used in FIG. 4 to FIG. 8 have positive values.

<Reading Operation>

Figure 4A:
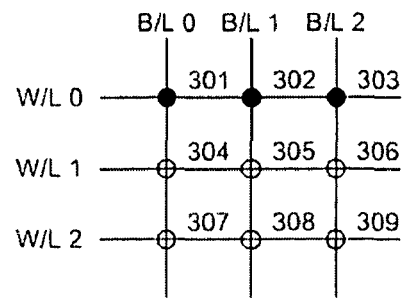
FIGS. 4(a) and 4(b) are a diagram illustrating a reading operation of a memory array using a mechanical switch according to a exemplary embodiment of the present invention.
Figure 4B:
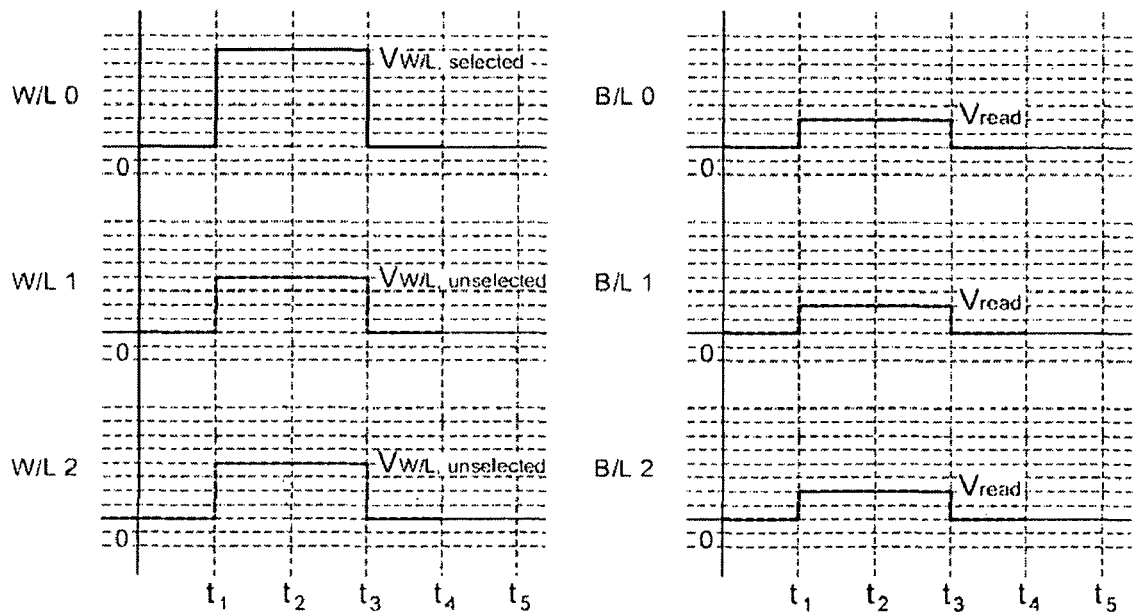

FIG. 4(a) is a mimetic diagram illustrating a memory array using a mechanical switch for explaining the present invention and FIG. 4(b) is a timing diagram illustrating a reading operation of a memory array using a mechanical switch according to a exemplary embodiment of the present invention.

As shown in FIGS. 4(a) and 4(b), a method for performing the reading operation of a memory array using a mechanical switch according to a exemplary embodiment of the present invention applies a read voltage $V_{read}$ to each of bit lines (B/L0, B/L1, and B/L2) of the memory cells 301, 302, 303 of the selected word line W/L0 and transfers to a source electrode. Herein, the read voltage $V_{read}$ is a voltage having a middle value of a sum of a write voltage $V_{write}$ and an erase voltage $V_{erase}$ (i.e. $V_{read} = \frac{1}{2} * (V_{write} + V_{erase})$).

A voltage $V_{W/L, selected}$ greater than a sum of the read voltage $V_{read}$ and a pull-in voltage $V_{pi}$ is applied to the selected word line W/L0 and transferred to a gate electrode (i.e. $V_{W/L, selected} = \frac{1}{2} * (V_{write} + V_{erase}) + V_{pi}$). A voltage $V_{W/L, unselected}$ smaller than a sum of the erase voltage $V_{erase}$ and the pull-in voltage $V_{pi}$ and a voltage greater than a difference between the write voltage $V_{write}$ and the pull-in voltage $V_{pi}$ is applied to the unselected word lines (W/L1 and W/L2). Consequently, an electrostatic force is generated between the source electrode and the gate electrode of the memory cells 301, 302, 303 of the selected word line W/L0, thereby making a dimple of the source electrode electrically contact with the drain electrode and making the read voltage $V_{read}$ applied to each of bit lines (B/L0, B/L1, and B/L2) transfer to each of capacitors of the memory cells 301, 302, 303. Accordingly, a charging state of an electric charge of the memory cells 301, 302, 303 to the selected word line W/L0 can be confirmed by sensing a transformation of the read voltage or a minute transformation of a read current through the source electrode as to whether each of capacitors is charged with the write voltage $V_{write}$ or the erase voltage $V_{erase}$.

The reading operation of a memory array using a mechanical switch according to an exemplary embodiment of the present invention is similar to that of DRAM, and can be inter-converted with an external circuit of a conventional memory for performing a reading operation.

<Writing Operation>

Figure 5A:
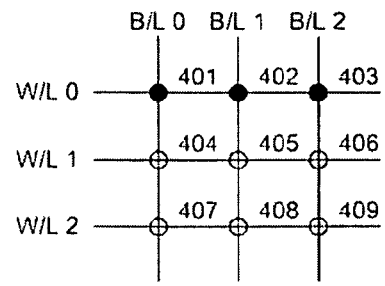
FIGS. 5(a) and 5(b) are a diagram illustrating a writing operation of a memory array using a mechanical switch according to another embodiment of the present invention.
Figure 5B:
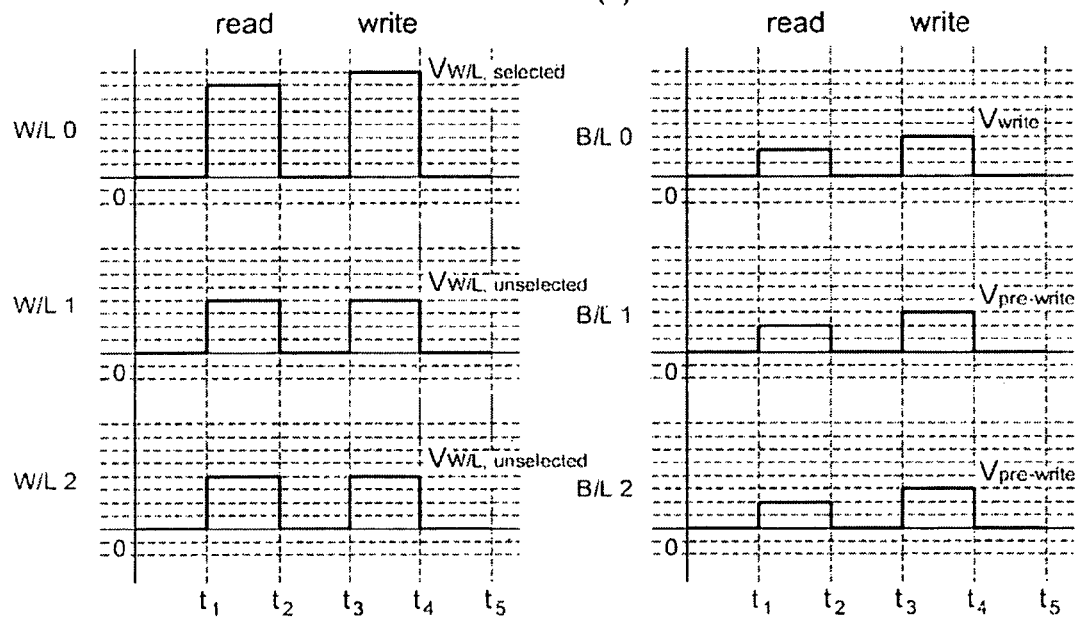

FIG. 5(a) is a mimetic diagram illustrating a memory array using a mechanical switch for explaining the present invention and FIG. 5(b) is a timing diagram illustrating a writing operation of a memory array using a mechanical switch according to another embodiment of the present invention.

As shown in FIGS. 5(a) and 5(b), a method for performing the wilting operation of a memory array using a mechanical switch according to another embodiment of the present invention can transfer a write voltage $V_{write}$ applied to the bit line B/L0 to a capacitor electrically connected to a drain electrode through a source electrode when a voltage difference between a dimple of the source electrode of the selected memory cell 401 and a gate electrode is more than a pull-in voltage $V_{pi}$. Before performing the writing operation of the selected memory cell 401, a charge state of the memory cell 401, 402, 403 is confirmed by performing the reading operation for the memory cells 401, 402, 403 of the selected word line. In other words, it confirms whether each of the memory cells 401, 402, 403 is a write state or an erase state.

After performing the reading operation, the write voltage $V_{write}$ for performing the writing operation is applied to the bit line B/L0 of the selected memory cell 401 and is transferred through the source electrode, and a pre-write voltage $V_{pre-write}$ confirmed by the reading operation is applied to the unselected bit lines (B/L1 and B/L2). Herein, the pre-write voltage $V_{pre-write}$ is defined as the same voltage as a voltage pre-stored on each of capacitors of the memory cells 402, 403 formed in the intersection of the selected word line W/L0 and the unselected bit lines (B/L1 and B/L2).

A voltage ($V_{W/L,selected} = V_{write} + V_{pi}$) greater than a sum of the write voltage $V_{write}$ and the pull-in voltage $V_{pi}$ is applied to the word line W/L0 of the selected memory cell 401 and transferred to the source electrode, and a voltage ($V_{write} - V_{pi} < V_{W/L,unselected} < V_{erase} + V_{pi}$) smaller than a sum of the erase voltage $V_{erase}$ and the pull-in voltage $V_{pi}$ and a voltage greater than a voltage difference between the write voltage $V_{write}$ and the pull-in voltage $V_{pi}$ is applied to the unselected word lines (W/L1 and W/L2).

Consequently, an electrostatic force is generated between the source electrode of the memory cells 401, 402, 403 of the selected word line W/L0 and the gate electrode, and a dimple of the source electrode electrically contacts with the drain electrode.

Accordingly, the write voltage $V_{write}$ applied to the selected bit line B/L0 is stored on a capacitor of the memory cell 401 formed in an intersection of the selected word line W/L0 and the selected bit line B/L0. The pre-write voltage $V_{pre-write}$ applied to the unselected bit lines (B/L1 and B/L2) is stored on a capacitor of the memory cells 402, 403 formed in an intersection of the selected word line W/L0 and the unselected bit lines (B/L1 and B/L2). In other words, the write voltage $V_{write}$ is stored only on the selected memory cell 401 although all of mechanical switches of the memory cells 401, 402, 403 of the selected word line W/L0 are turn on and the pre-write voltage pre-stored on the capacitor is stored on other memory cells 402, 403.

The dimple of the source electrode generates an analogue operation to the direction of the drain electrode in proportion to the applied voltage difference between the source electrode and the gate electrode when a magnitude of the dimple formed in the source electrode of the memory array using the mechanical switch is more than two third of a distance of a mobile part and the gate electrode, and directly or indirectly contacts with the drain electrode. If the memory array is formed by using the mechanical switch contacted indirectly, then a phenomenon like a bouncing and welding generated in a general mechanical switch can be prevented, thereby improving a mechanical and electrical reliability of the memory array using the mechanical switch.

<Erasing Operation>

Figure 6A:
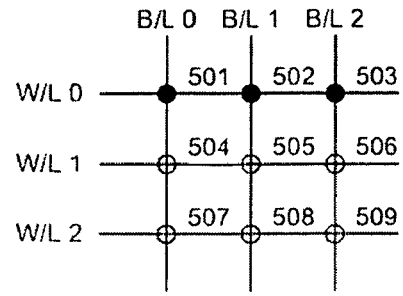
FIGS. 6(a) and 6(b) are a diagram illustrating an erasing operation of a memory array using a mechanical switch according to another embodiment of the present invention.
Figure 6B:
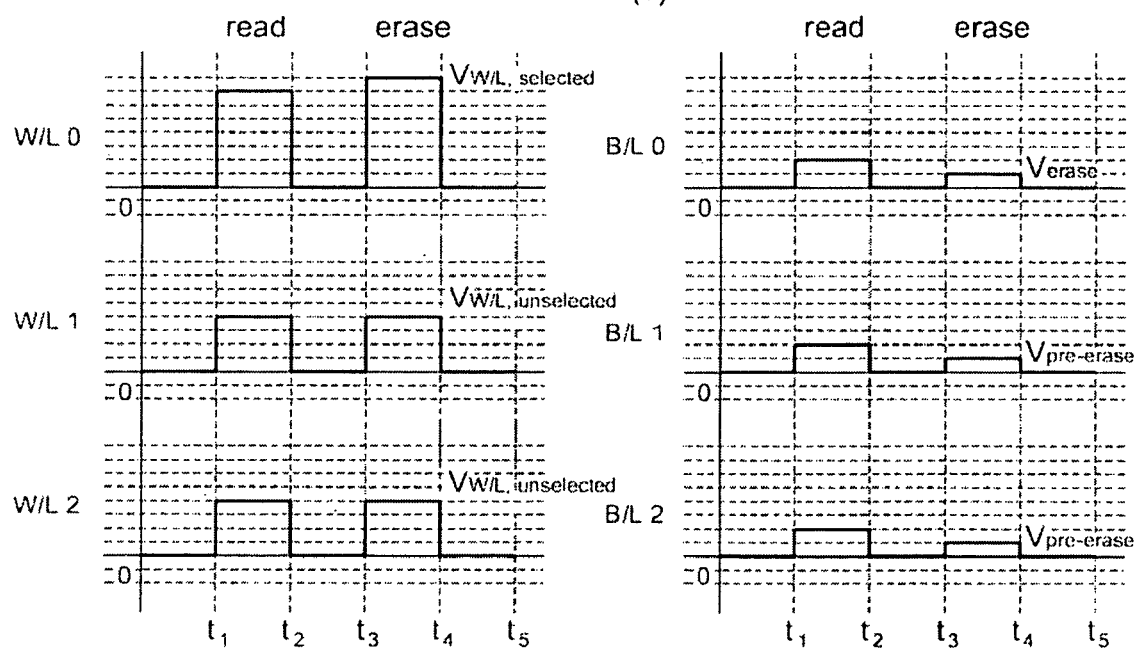

FIG. 6(a) is a mimetic diagram illustrating a memory array using a mechanical switch for explaining the present invention and FIG. 6(b) is a timing diagram illustrating an erasing operation of a memory array using a mechanical switch according to another embodiment of the present invention.

As shown in FIGS. 6(a) and 6(b), the reading operation before performing the erasing operation of a memory array using a mechanical switch according to another embodiment of the present invention is performed, thereby a charge state of the memory cells 501, 502, 503 of a selected word line W/L0 being confirmed.

After performing the reading operation, an erase voltage $V_{erase}$ for performing the erasing operation is applied to a bit line B/L0 of the selected memory cell 501 and transferred through a source electrode. Also, a pre-erase voltage $V_{pre-erase}$ confirmed by the reading operation is applied to an unselected bit lines (B/L1 and B/L2). Herein, the pre-erase voltage $V_{pre-erase}$ is defined as the same voltage as a voltage pre-stored on each of capacitors of the memory cells 502, 503 formed in the intersection of the selected word line W/L0 and the unselected bit lines (B/L1 and B/L2).

A voltage ($V_{W/L,selected} = V_{erase} + V_{pi}$) greater than a sum of the write voltage $V_{erase}$ and the pull-in voltage $V_{pi}$ is applied to the word line W/L0 of the selected memory cell 501 and transferred to the source electrode, and a voltage ($V_{write} - V_{pi} < V_{W/L,selected} < V_{erase} + V_{pi}$) smaller than a sum of the erase voltage $V_{erase}$ and the pull-in voltage $V_{pi}$ and greater than a voltage difference between the write voltage $V_{write}$ and the pull-in voltage $V_{pi}$ is applied to the unselected word lines (W/L1 and W/L2) and transferred to a gate electrode.

Consequently, a electrostatic force is generated between the source electrode of the memory cells 501, 502, 503 of the selected word line W/L0 and the gate electrode, and a dimple of the source electrode electrically contacts with a drain electrode.

Accordingly, the erase voltage $V_{erase}$ applied to the selected bit line B/L0 is stored on a capacitor of the memory cell 501 formed in an intersection of the selected word line W/L0 and the selected bit line B/L0. Also, the pre-erase voltage $V_{pre-erase}$ applied to the unselected bit lines (B/L1 and B/L2) is stored on a capacitor of the memory cells 502, 503 formed in an intersection of the selected word line W/L0 and the unselected bit lines (B/L1 and B/L2). In other words, the erase voltage $V_{erase}$ is stored only on the selected memory cell 501 although mechanical switches of the memory cells 501, 502, 503 of the selected word line W/L0 are turn on and the pre-erase voltage pre-stored on the capacitor is stored on other memory cells 502, 503.

<Multi-Bit Operation>

Figure 7A:
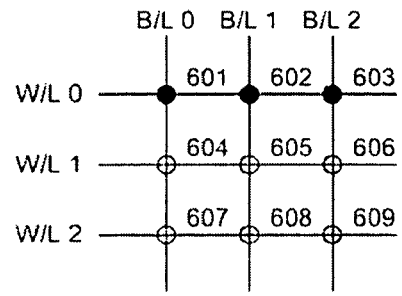
FIGS. 7(a) and 7(b) are a diagram illustrating a multi-bit writing operation of a memory array using a mechanical switch according to another embodiment of the present invention.
Figure 7B:
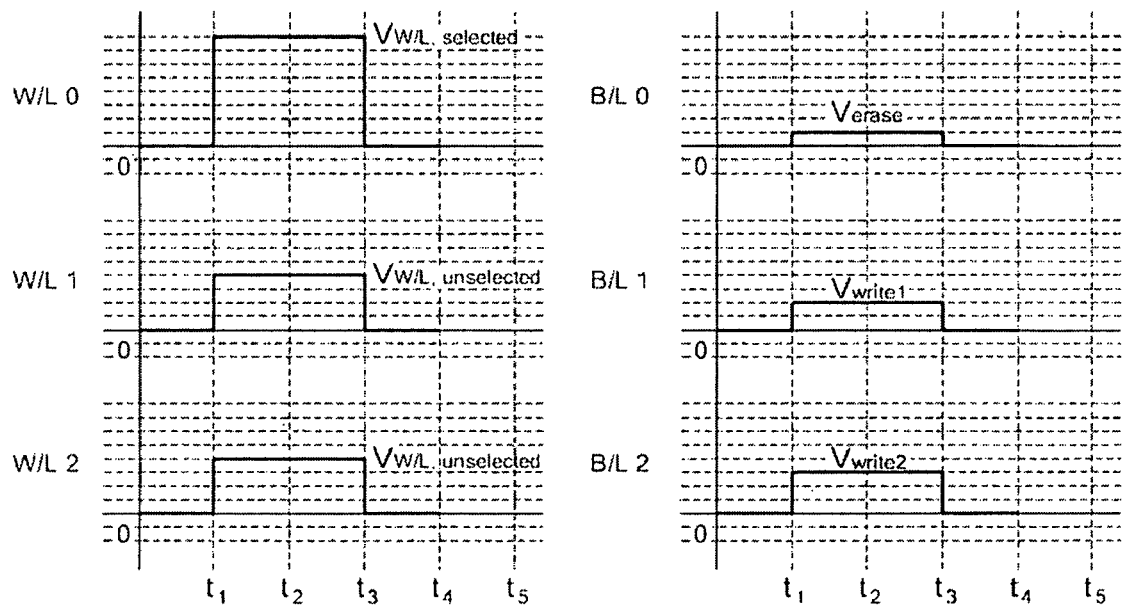

FIG. 7(a) is a mimetic diagram illustrating a memory array using a mechanical switch for explaining the present invention and FIG. 7(b) is a timing diagram illustrating a multi-bit writing operation of a memory array using a mechanical switch according to another embodiment of the present invention.

As shown in FIGS. 7(a) and 7(b), a method for performing a multi-bit writing operation of a memory array using a mechanical switch according to another embodiment of the present invention applies various erase voltages or write voltages of $V_{erase}$, $V_{write1}$, and $V_{write2}$ ($V_{erase} < V_{write1} < V_{write2}$) to each of the bit lines (B/L0, B/L1, and B/L2) of the memory cells 601, 602, 603 of a selected word line W/L0 and transfers through a source electrode, and applies a voltage ($V_{W/L,selected} = V_{write2} + V_{pi}$) greater than a sum of a maximal voltage among various erase voltages or write voltages of $V_{erase}$, $V_{write1}$, and $V_{write2}$ ($V_{erase} < V_{write1} < V_{write2}$) and a pull-in voltage to the selected word line W/L0.

It applies a voltage ($V_{write2} - V_{pi} < V_{W/L,unselected} < V_{erase} + V_{pi}$) smaller than a sum of the erase voltage $V_{erase}$ and a pull-in voltage $V_{pi}$ and a voltage greater than a voltage difference between the maximal voltage $V_{write2}$ and the pull-in voltage $V_{pi}$ to an unselected word lines (W/L1 and W/L2), and transfers to a gate electrode.

Consequently, a electrostatic force is generated between the source electrode of the memory cells 601, 602, 603 of the selected word line W/L0 and the gate electrode, and a dimple of the source electrode electrically contacts with a drain electrode.

Accordingly, the voltages ($V_{erase}$, $V_{write1}$, and $V_{write2}$) applied to each of the bit lines (B/L0, B/L1, and B/L2) are stored on each of capacitors and thus, can perform the multi-bit operation of a memory array using a mechanical switch according to further another embodiment of the present invention.

In other words, The write voltage or erase voltage having a different magnitude of voltage is applied to the plurality of bit lines intersected with the selected word line of the memory array using the mechanical switch, thereby a capacity of a charge stored on the capacitor being able to be controlled. Therefore, the memory which can store easily the multi-bit can be embodied.

<Method for Performing a Selecting Operation of a Only Single Memory Cell>

Figure 8A:
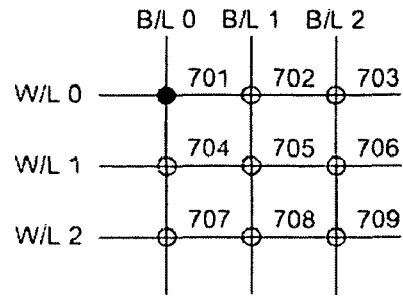
FIGS. 8(a) and 8(b) are a diagram illustrating a selecting operation of a single memory cell of a memory array using a mechanical switch according to another embodiment of the present invention.
Figure 8B:
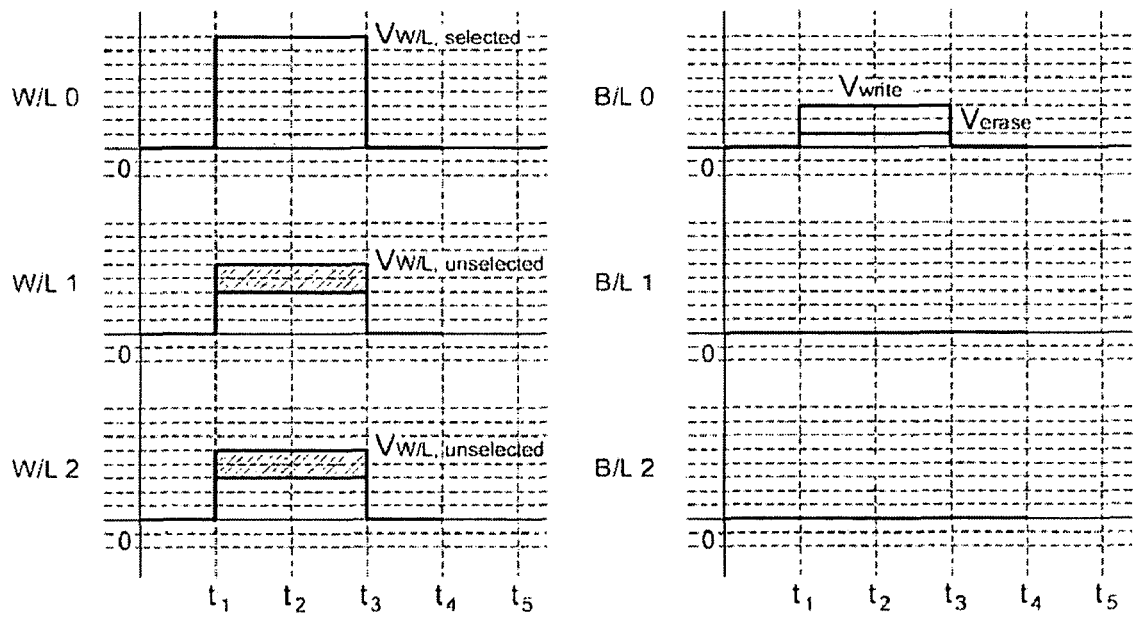

FIG. 8(a) is a mimetic diagram illustrating a memory array using a mechanical switch for explaining the present invention and FIG. 8(b) is a timing diagram illustrating a method for performing a selecting operation of a single memory cell of a memory array using a mechanical switch according to further another embodiment of the present invention.

As shown in FIGS. 8(a) and 8(b), a method for performing a selecting operation of a single memory cell of a memory array using a mechanical switch according to further another embodiment of the present invention applies a voltage ($V_{write} + V_{pi}$) greater than a sum of a write voltage $V_{write}$ and a pull-in voltage $V_{pi}$ to a word line W/L0 of a selected memory cell.

It applies the write voltage $V_{write}$ or erase voltage $V_{erase}$ to the bit line B/L0 of the selected memory cell 701 and does not a voltage to an unselected bit lines B/L1, B/L2.

It applies a voltage ($V_{write} < V_{W/L,unselected} > V_{erase} + V_{pi}$) smaller than a sum of the erase voltage $V_{erase}$ and the pull-in voltage $V_{pi}$ and a voltage greater than the write voltage $V_{write}$, or a voltage ($V_{erase} < V_{W/L,unselected} > V_{write} - V_{pi}$) smaller than a voltage difference between the write voltage $V_{write}$ and the pull-in voltage $V_{pi}$ and a voltage greater than the erase voltage $V_{erase}$ to the unselected word lines (W/L1 and W/L2), and transfers to a gate electrode.

Consequently, an electrostatic force is generated between the source electrode and the gate electrode at the only mechanical switch of the selected single memory cell 701 and the gate electrode, and the dimple of the source electrode electrically contacts with the drain electrode. Accordingly, the write voltage or erase voltage applied to the selected bit line are transferred to the capacitor and are stored on it.

As described above, a method for operating the memory array using the mechanical switch of the present invention is performed by the voltage difference applied to the source electrode of the mechanical switch and the gate electrode unlike a DRAM Therefore, a single memory cell can be selected only in combination with a source voltage and a gate voltage, thereby performing a random access addressing.

Consequently, the present invention provides a method for operating (i.e., reading, wilting, erasing) a memory array constructed using a mechanical switch, and also provides an multi-bit operating method of a memory array constructed using a mechanical switch, and also provides a method for performing a selecting operation of a single memory cell of a memory array constructed using a mechanical switch.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for operating a memory array using a mechanical switch, in which the memory array comprises: a plurality of word lines; a plurality of bit lines intersecting the plurality of word lines; a gate electrode connected to each of the word lines; a drain electrode spaced apart from the gate electrode and connected to a capacitor; and a source electrode, the source electrode comprising: an anchor part spaced apart from the gate electrode and connected to each of the bit lines; and a mobile part having a dimple formed therein, the method comprising:
   applying a first voltage $V_1$ to a bit line selected from the plurality of bit lines;
   applying a second voltage $V_2$ greater than a sum of the first voltage $V_1$ and a pull-in voltage $V_{pi}$ to the word lines selected from the plurality of word lines; and
   applying a voltage that is smaller than a sum of an erase voltage $V_{erase}$ and the pull-in voltage $V_{pi}$ and greater than a difference between a write voltage $V_{write}$ and the pull-in voltage $V_{pi}$ to unselected word lines of the plurality of word lines.

2. The method of claim 1, wherein the first voltage $V_1$ is a read voltage $V_{read}$, and the read voltage $V_{read}$ is one-half of a sum of the write voltage $V_{write}$ and the erase voltage $V_{erase}$.

3. The method of claim 1, wherein the first voltage $V_1$ is the write voltage $V_{write}$.

4. The method of claim 3, further comprising the step of applying a pre-write voltage $V_{pre-write}$ to unselected bit lines of the plurality of bit lines.

5. The method of claim 1, wherein the first voltage $V_1$ is the erase voltage $V_{erase}$.

6. The method of claim 5, further comprising the step of applying a pre-erase voltage $V_{pre-erase}$ to unselected bit lines of the plurality of bit lines.

7. A method for operating a memory array using a mechanical switch, in which the memory array comprises: a plurality of word lines; a plurality of bit lines intersecting the plurality of word lines; a gate electrode connected to each of the word lines; a drain electrode spaced apart from the gate electrode and connected to a capacitor; and a source electrode, the source electrode comprising: an anchor part spaced apart from the gate electrode and connected to each of the bit lines; and a mobile part having a dimple formed therein, the method comprising:
   applying respectively write voltages $V_{write}$ or erase voltages $V_{erase}$ having different voltage magnitudes to two or more bit lines selected from the plurality of bit lines;
   applying a voltage that is greater than a sum of a maximal write voltage $V_{write-max}$ and a pull-in voltage $V_{pi}$ of the write voltages $V_{write}$ or the erase voltages $V_{erase}$ to one or more word lines selected from the plurality of word lines; and applying a voltage that is smaller than a sum of the erase voltages $V_{erase}$ and the pull-in voltage $V_{pi}$ and greater than a difference between the maximal write voltage $V_{write-max}$ and the pull-in voltage $V_{pi}$ to unselected bit lines of the plurality of bit lines.

8. A method for operating a memory array using a mechanical switch, in which the memory array comprises: a plurality of word lines; a plurality of bit lines intersecting the plurality of word lines; a gate electrode connected to each of the word lines; a drain electrode spaced apart from the gate electrode and connected to a capacitor; and a source electrode, the source electrode comprising; an anchor part spaced apart from the gate electrode and connected to each of the bit lines; and a mobile part having a dimple formed therein, the method comprising:

applying a write voltage $V_{write}$ or an erase voltage $V_{erase}$ to a bit line selected from the plurality of bit lines;

applying a voltage that is greater than a sum of the write voltage $V_{write}$ and a pull-in voltage $V_{pi}$ to the word lines selected from the plurality of word lines; and applying a voltage that is smaller than a sum of the erase voltage $V_{erase}$ and the pull-in voltage $V_{pi}$ and greater than the write voltage $V_{write}$, or a voltage that is smaller than a difference between the write voltage $V_{write}$ and the pull-in voltage $V_{pi}$ and greater than the erase voltage $V_{erase}$ to unselected word lines of the plurality of word lines.

* * * * *